United States Patent
Corsaut (12)

(10) Patent No.: US 12,035,426 B1
(45) Date of Patent: Jul. 9, 2024

(54) SYSTEM, METHOD AND APPARATUS FOR APPLICATION OF INFRARED RADIATION

(71) Applicant: John D. Corsaut, Corona, CA (US)

(72) Inventor: John D. Corsaut, Corona, CA (US)

( * ) Notice: Subject to any disclaimer, the term of this patent is extended or adjusted under 35 U.S.C. 154(b) by 832 days.

(21) Appl. No.: 17/115,584

(22) Filed: Dec. 8, 2020

Related U.S. Application Data

(60) Provisional application No. 62/945,799, filed on Dec. 9, 2019.

(51) Int. Cl.
| | |
|---|---|
| *H05B 1/02* | (2006.01) |
| *G02B 5/10* | (2006.01) |
| *G06F 3/0482* | (2013.01) |
| *H05B 3/00* | (2006.01) |
| *H05K 7/20* | (2006.01) |

(52) U.S. Cl.
CPC ............... *H05B 1/025* (2013.01); *G02B 5/10* (2013.01); *G06F 3/0482* (2013.01); *H05B 3/0085* (2013.01); *H05K 7/20136* (2013.01); *H05B 2203/032* (2013.01)

(58) Field of Classification Search
CPC . G02B 5/02; B29C 66/5224; B29C 66/52241; B29C 65/1406; B29C 65/16
See application file for complete search history.

(56) References Cited

U.S. PATENT DOCUMENTS

| | | | |
|---|---|---|---|
| 6,280,801 B1 * | 8/2001 | Schmitt ................ | B41M 7/0081 427/493 |
| 2008/0175571 A1 * | 7/2008 | Aggarwal ......... | H01L 21/67115 392/416 |
| 2012/0085926 A1 * | 4/2012 | Ingram .................... | G02B 5/02 250/454.11 |
| 2014/0246603 A1 * | 9/2014 | Wilson ................... | B05D 3/067 250/492.1 |

OTHER PUBLICATIONS

Full Spectrum Technologies, "Infrared Small Area Emitter System-Single/Dual", pp. 1-4.

\* cited by examiner

*Primary Examiner* — Thien S Tran
(74) *Attorney, Agent, or Firm* — Rutan & Tucker LLP; Kyle M. St. James

(57) ABSTRACT

An infrared energy supply system is disclosed including an infrared (IR) energy emitter device including a heat dissipating housing including an internal cavity that houses an IR bulb, an interior reflection unit and a cooling fan, an outer reflection unit coupled to the heat dissipating housing that includes a curved reflection component extending outwardly from the heat dissipating housing and side reflection components that extend outward from the heat dissipating on opposite sides of the curved reflection component, and a guide rail disposed on both sides of the outer reflection unit. The infrared energy supply system further includes a control unit coupled to the infrared energy emitter device via a coupling device. In some instances, the internal cavity houses multiple IR bulbs where emitted IR rays reflect off of the interior reflection unit and the curved reflection component to culminate at a first focal point and a second focal point.

22 Claims, 13 Drawing Sheets

SYSTEM, METHOD AND APPARATUS FOR APPLICATION OF INFRARED RADIATION

CROSS-REFERENCE TO RELATED APPLICATIONS

This application claims the benefit of priority on U.S. Provisional Patent Application No. 62/945,799, titled "System, Method and Apparatus for Uniform Application of Infrared Radiation" and filed Dec. 9, 2019, the entire contents of which are incorporated by reference herein.

FIELD

Embodiments of the disclosure relate to the field of infrared energy transmission. More specifically, one embodiment of the disclosure relates to a system for applying infrared energy to a focal point using a reflection unit.

GENERAL BACKGROUND

In the medical instrument manufacturing industry, a variety of technologies are widely used throughout in manufacture processes. One technology found and commonly used in the construction of catheters is the hot air system or known as the "hot box". This device raises temperatures of compressed air through a heated tube as it passes through. The heated air exits through a nozzle that diffuses the airflow and creates a small pocket of hot air. Temperatures of this air are regulated by a thermocouple suspended in the airstream and feeds back to a proportional-integral-derivative (PID) controller. The PID controller controls the heating elements surrounding the tube increasing or decreasing output to maintain a set temperature. For this device to function, it requires a constant supply of compressed air and electrical energy to maintain a specific heat output for a specific flow rate.

In some embodiments, the heated air may be used in medical instrument, e.g., catheter, manufacturing. In such embodiments, the heated air may be applied to laminate layers of plastic tubing together to form a flexible, yet rigid instrument used to navigate the human body internally. Construction of catheters typically consists of an inner liner of a low friction material such as TEFLON® tubing surrounded by a fine stainless-steel wire coil and/or braid. The outer sheath may be made from a thermoplastic elastomer (TPE) such as PEBAX® or VESTAMID® E.

The lamination process is typically done by placing the PEBAX® tubing over the coiled liner assembly. A sacrificial shrink tube, usually of a polyolefin material, is then place over this entire assembly prior to the laminating process. High heat is applied using the hot box which shrinks the polyolefin tubing, reflowing the PEBAX® and forming the outer sheath. Once cooled, the polyolefin tube is removed, and the assembly of the catheter shaft is complete. This is just one example where hot box technology is used in the manufacturing of medical instruments.

The Food and Drug Administration (FDA) heavily regulates this industry and demands more controlled processes. They require each manufacturer to document and validate each process to ensure repeatability.

Hot box technology is a legacy technology that has been utilized prior to enactment of such controls set forth by the FDA and has maintained its acceptance as a viable method of applying heat as no other method has been explored in depth to replace it. The drawbacks of using this technology is the inability to validate a process using this technology. Since this is a convective heat source essentially using hot moving air to transfer heat, it is difficult to maintain a consistent output, therefore, making it nearly impossible to validate. Other issues are, as manufacturing lines grow use of this equipment increases, so does the demand for compressed air and electrical power to maintain temperatures usually around 500° F. Too is the increased demand on air conditioning to maintain comfortable work environments. Though this is accepted, there is room for improvement.

It should be understood that the term "medical instrument" as used herein may include at least catheters, guidewires, or stylets. Further, the examples disclosed herein may apply equally to catheters, guidewires, or stylets.

BRIEF DESCRIPTION OF THE DRAWINGS

Embodiments of the disclosure are illustrated by way of example and not by way of limitation in the figures of the accompanying drawings, in which like references indicate similar elements and in which.

DETAILED DESCRIPTION

Figure 1:
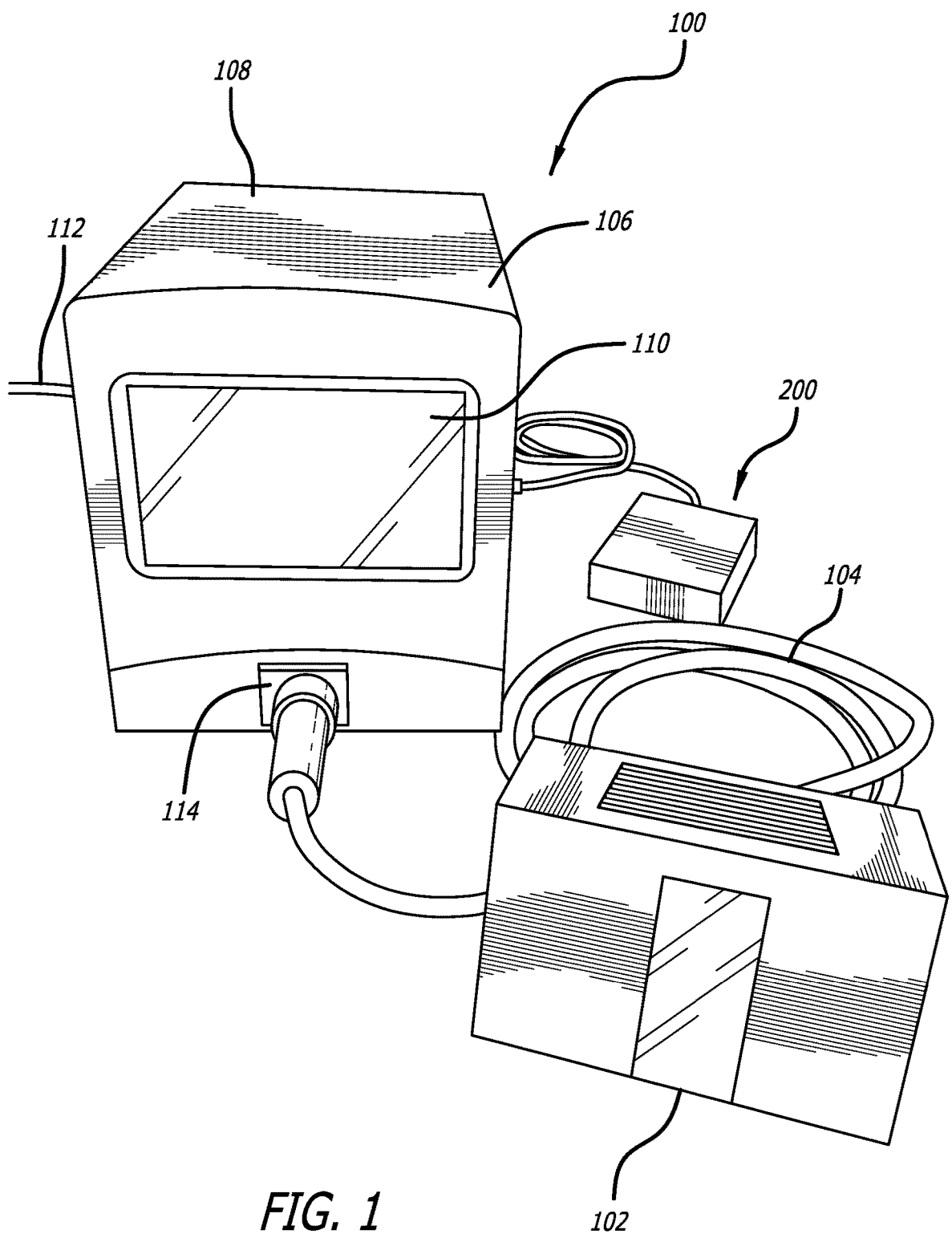
FIG. 1 illustrates an exemplary embodiment of an infrared energy supply system in accordance with some embodiments.

Infrared (IR), or radiant heat with wavelengths between 600 nm and 5 microns, is heat energy transmitted from a source and is not dependent on air to convey heat. In terms of heat transfer efficiency, radiant heat and convection heat each have very different heat transfer properties. For example, convection heaters (e.g., "hot boxes") heat air, which retains heat poorly and dissipates with any drafts. Any airflow near a hot box will interfere with heat transfer and cause an inconsistent heating process. In contrast, radiant heating apparatuses heat objects in the environment and as the object warms, heat is radiated back. Radiant heat holds considerable advantages over convective heat as radiant heat is independent of airflow and delivers a precise amount of energy to a mass (an object). Additionally, radiant heat has a higher "flux" (watts output per meter per degree centigrade of the heater) than convection heat. Therefore, in order to heat a mass using radiant heat, less energy and time are required than would be to heat the same mass by a convective heating process.

Various embodiments provided below describe a system, method or apparatus for applying heat to a mass using radiant heat by capitalizing on the advantages of radiant heat as compared to convection heat. For example, some embodiments of the disclosure describe the utilization of reflective geometry of an ellipse wherein radiant heat energy is emitted from at least a first source at a first foci (F1) and is focused at a second focal point (F2) some distance away. In such embodiments, IR energy is emitted in all directions from the first source and an elliptical reflector reflects all (or substantially all) of the energy toward a target at F2. Due to the configuration of the elliptical reflector described below, the target absorbs heat energy uniformly along its circumference, which results in an increase in the temperature of the target.

I. Terminology

In the following description, certain terminology is used to describe features of the invention. For example, in certain situations, the term "logic" and "component" are representative of hardware, firmware or software that is configured to perform one or more functions. As hardware, a component (or logic) may include circuitry having data processing or storage functionality. Examples of such circuitry may include, but are not limited or restricted to a hardware processor (e.g., microprocessor with one or more processor cores, a digital signal processor, a programmable gate array, a microcontroller, an application specific integrated circuit "ASIC," etc.), a semiconductor memory, or combinatorial elements.

Alternatively, the component (or logic) may be software, such as executable code in the form of an executable application, an Application Programming Interface (API), a subroutine, a function, a procedure, an applet, a servlet, a routine, source code, object code, a shared library/dynamic load library, or one or more instructions. The software may be stored in any type of a suitable non-transitory storage medium, or transitory storage medium (e.g., electrical, optical, acoustical or other form of propagated signals such as carrier waves, infrared signals, or digital signals). Examples of non-transitory storage medium may include, but are not limited or restricted to a programmable circuit; semiconductor memory; non-persistent storage such as volatile memory (e.g., any type of random access memory "RAM"); or persistent storage such as non-volatile memory (e.g., read-only memory "ROM," power-backed RAM, flash memory, phase-change memory, etc.), a solid-state drive, hard disk drive, an optical disc drive, or a portable memory device. As firmware, the executable code may be stored in persistent storage.

The term "computing device" should be construed as electronics with the data processing capability and/or a capability of connecting to any type of network, such as a public network (e.g., Internet), a private network (e.g., a wireless data telecommunication network, a local area network "LAN", etc.), or a combination of networks. Examples of a computing device may include, but are not limited or restricted to, the following: a server, an endpoint device (e.g., a laptop, a smartphone, a tablet, a desktop computer, a netbook, a medical device, or any general-purpose or special-purpose, user-controlled electronic device); a mainframe; a router; or the like.

A "message" or "signal" generally refers to information transmitted in one or more electrical signals that collectively represent electrically stored data in a prescribed format. Each message may be in the form of one or more packets, frames, HTTP-based transmissions, or any other series of bits having the prescribed format.

The term "computerized" generally represents that any corresponding operations are conducted by hardware in combination with software and/or firmware.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

II. Infrared Energy Supply System

As will be discussed below, an infrared energy supply system is disclosed in accordance with multiple embodiments. The infrared energy supply system may include an infrared energy emitter device that is coupled to a control unit via a coupling device. Output heat of the emitter device is controlled and monitored by the control unit (e.g., logic being processed via one or more processors or a first control circuit board). In some embodiments, the control unit includes is a display (e.g., 5" touch screen) that acts as the interface for a user and may receive user input. Logic is stored on non-transitory computer-readable medium of the control until, and execution of the logic by one or more processors may cause rendering of a Graphical User Interface (GUI) on the display. The GUI enables the control unit to receive user input. Navigation of the various display screens of the GUI via user input and receipt of further user input indicating selection of a heating operation enables the control unit to execute logic causing performance of a desired heat cycle by the emitter device. More specifically in some embodiments, the execution of the logic resulting from selection of a desired heat cycle causes a secondary power output control circuit board is used to control the high voltage output to the emitter bulb using Pulse Width Modulation (PWM) to vary output. The secondary power output control circuit board receives a low voltage signal from the first control circuit board, as determined by execution of the logic, to change and set the output to the emitter. In some embodiments, the secondary power output control circuit board sends a low voltage signal back to the first control circuit board providing closed loop feedback in real time with respect to actual power output. This feedback may be shown on the display and/or monitored by logic on the first control circuit board.

Optional features for this device may include an integrated feed system to automatically feed a workpiece (a mass) through the infrared energy at a predetermined position, an integrated air-cooling device for cooling the workpiece immediately after the heating process, and a mounted camera to display an image of the workpiece in the emitter device, which may be displayed on the display of the control unit or on an external monitor.

Referring now to FIG. 1, an exemplary embodiment of an infrared energy supply system is shown in accordance with some embodiments. The infrared energy supply system 100 includes an infrared energy emitter device 102, a coupling device 104 and a control unit 106. The infrared energy emitter device 102 may include one or more infrared emitting bulbs and a reflector to project radiant heat energy. In one embodiment, the coupling device 104 may be an electrical cord that provides power and instructions (e.g., in the form of electrical signals) to infrared energy supply device 102 from the control unit 106. The control unit 106 may include a housing 108, a display screen 110, a power cord 112, and a coupling device receptacle 114.

Figure 2:
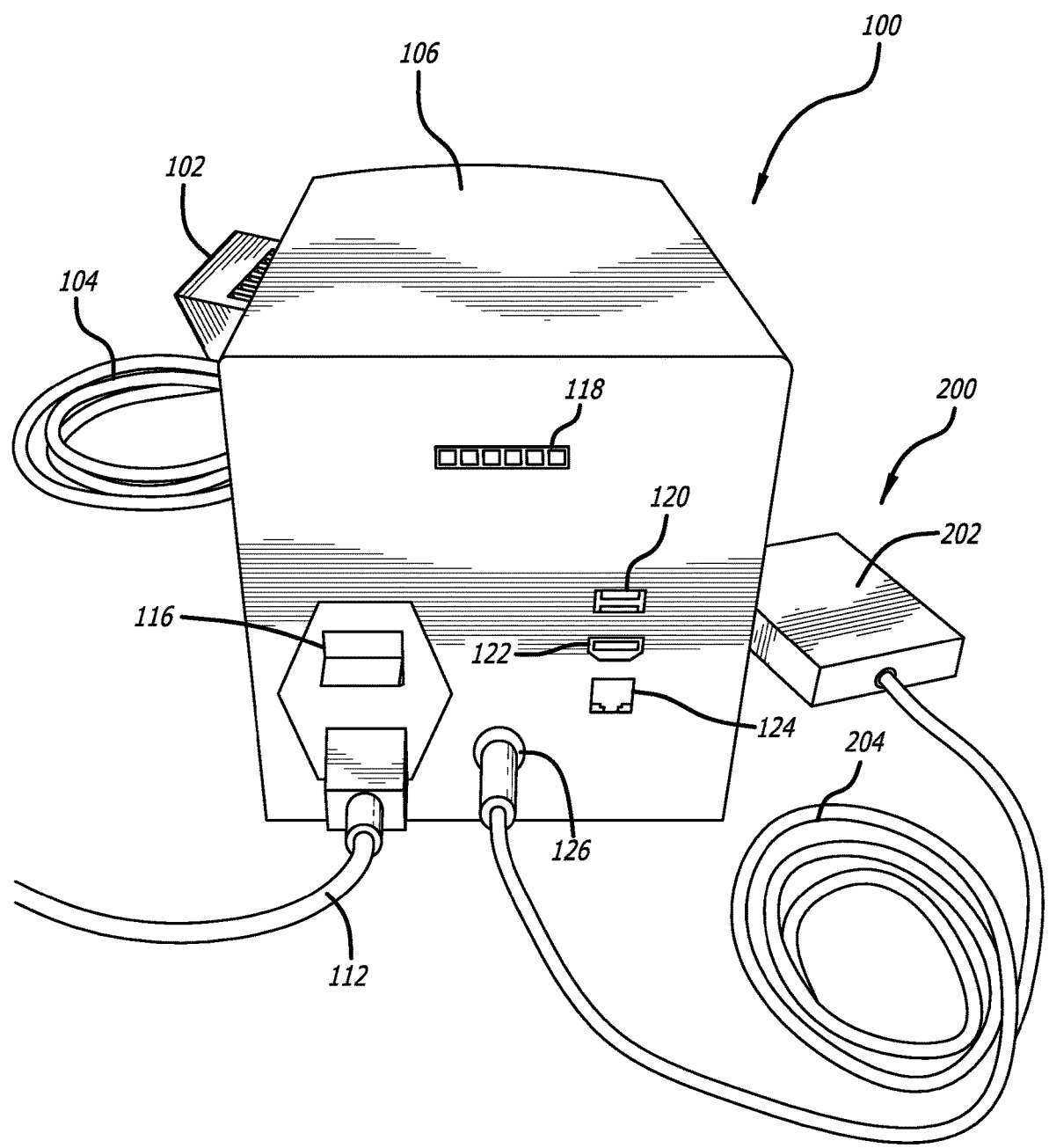
FIG. 2 illustrates an exemplary embodiment of the backside of the infrared energy supply system 100 in accordance with some embodiments.

Referring now to FIG. 2, an exemplary embodiment of the backside of the infrared energy supply system 100 is shown in accordance with some embodiments. The infrared energy supply device remote system ("remote system") 200 is shown communicatively coupled to the control unit 106. The remote system 200 may include a switch 202 and a control circuit cable 204. In one embodiment, as shown, the switch 202 may take the form of a foot pedal switch; however, the disclosure is not so limited and the switch 202 may take any form providing functionality of providing a signal to the control unit providing a control signal as to the provision of power to the infrared energy emitter device 102.

The housing 108 includes a power switch 116, input/output terminals 118, one or more USB ports 120, one or more HDMI ports 122, one or more Ethernet ports 124 and a port or receptacle 126 configured to receive the control circuit cable 204.

a. Exemplary Display Screen

The GUI referenced above has several different display screens which allow the user to input desired settings for a heating process and receive feedback in real-time of the output. The first display screen (default display screen) displays feedback in real-time from the actual power being supplied. This gives users an indication of heat energy being emitted toward the workpiece. It also displays current process steps and output level from the program (heat cycle), cycle start button, and emergency stop button as is illustrated in FIGS. 3A-3B.

A second exemplary display screens show output of emitters in a graphical format of Watts versus time. Such a graph may chart, in real-time, as the heating process is happening, as shown in FIG. 3C. A third exemplary display screen illustrate a plurality of input fields (text fields, input buttons, etc.), which may include entry of a password and program steps. Other input fields include emitter recalibration, program save, and program upload to Power Source Unit (PSU) as shown in FIG. 3D. As a fourth exemplary display screen illustrates a display space reserved for receipt of user input pertaining to and/or display of advanced settings such as password settings, idle output setting, optional feed control settings, options enable/disable, etc., as shown in FIG. 3E.

Figure 3A:
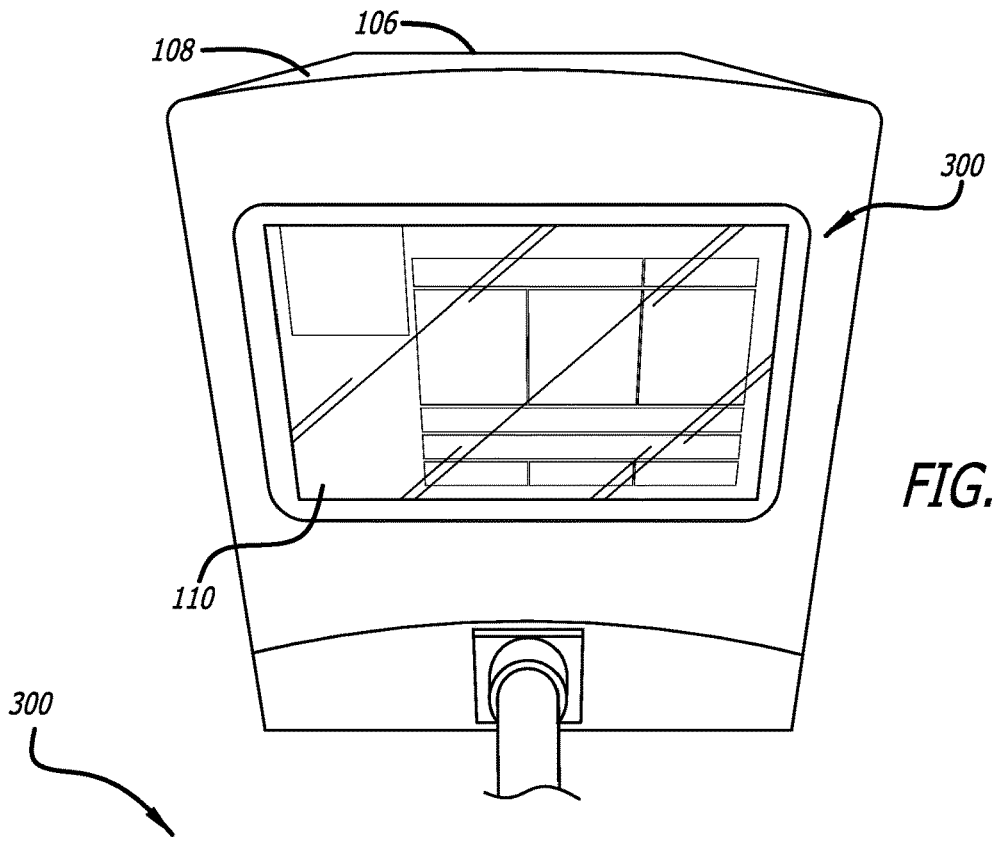
FIGS. 3A-3E illustrate plurality of exemplary graphic user interface display screens in accordance with some embodiments.
Figure 3B:
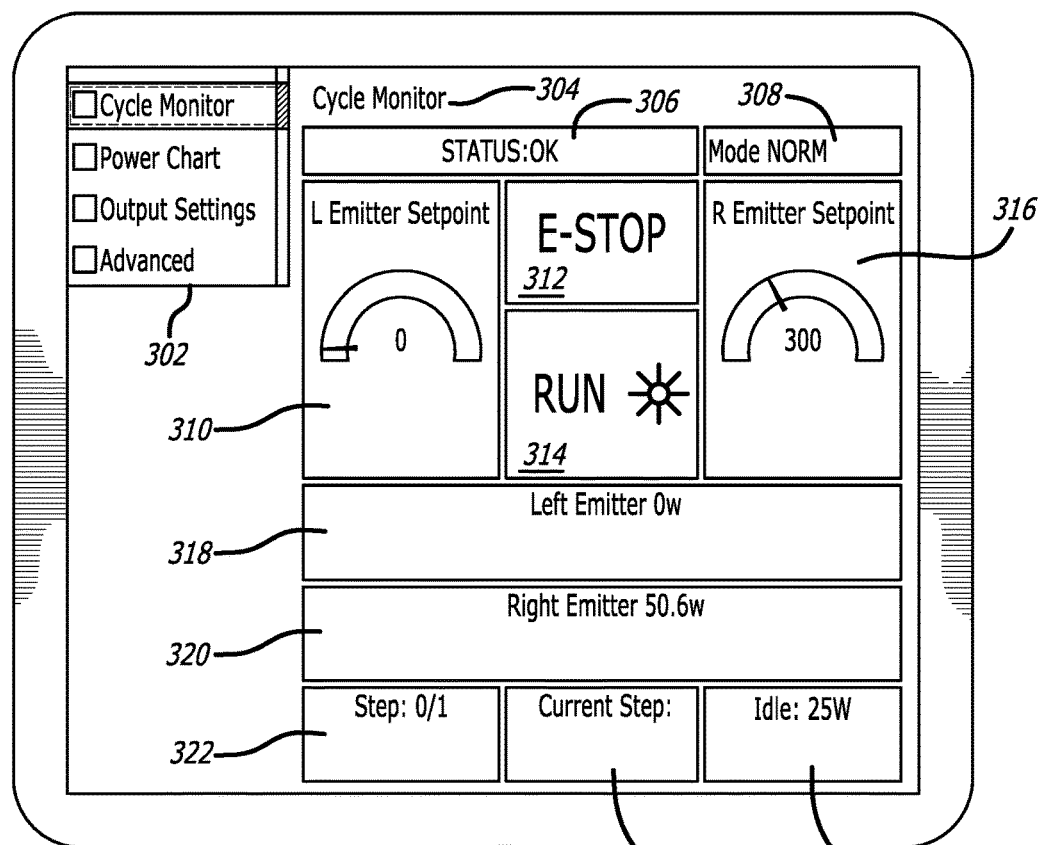
Figure 3C:
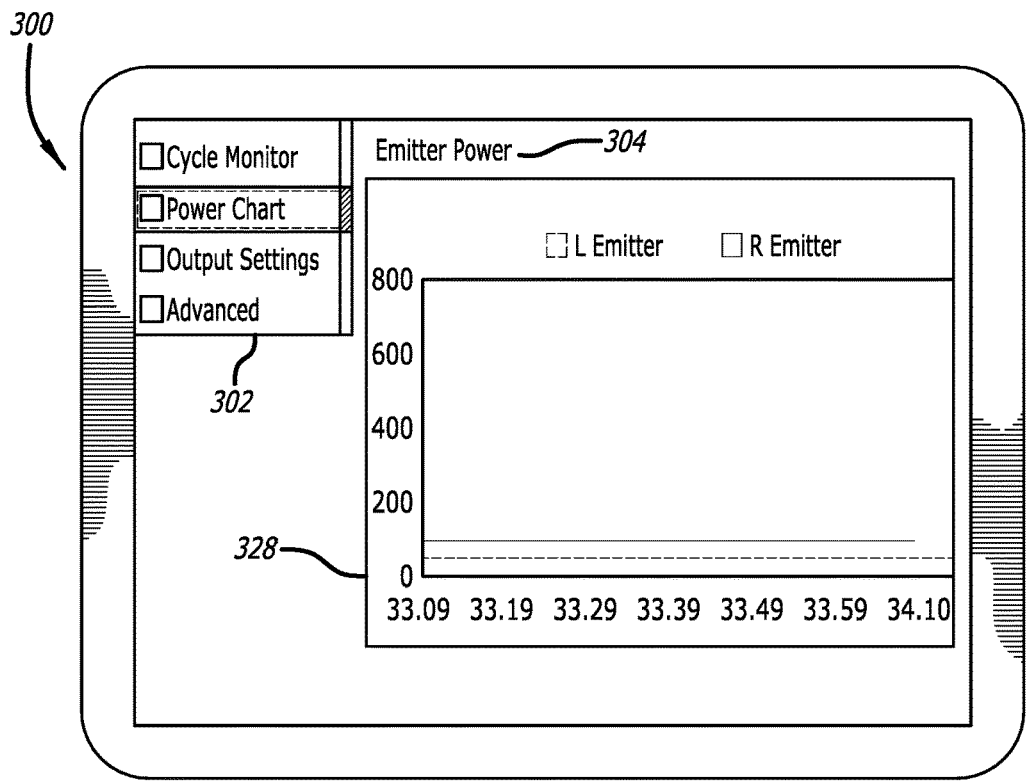
Figure 3D:
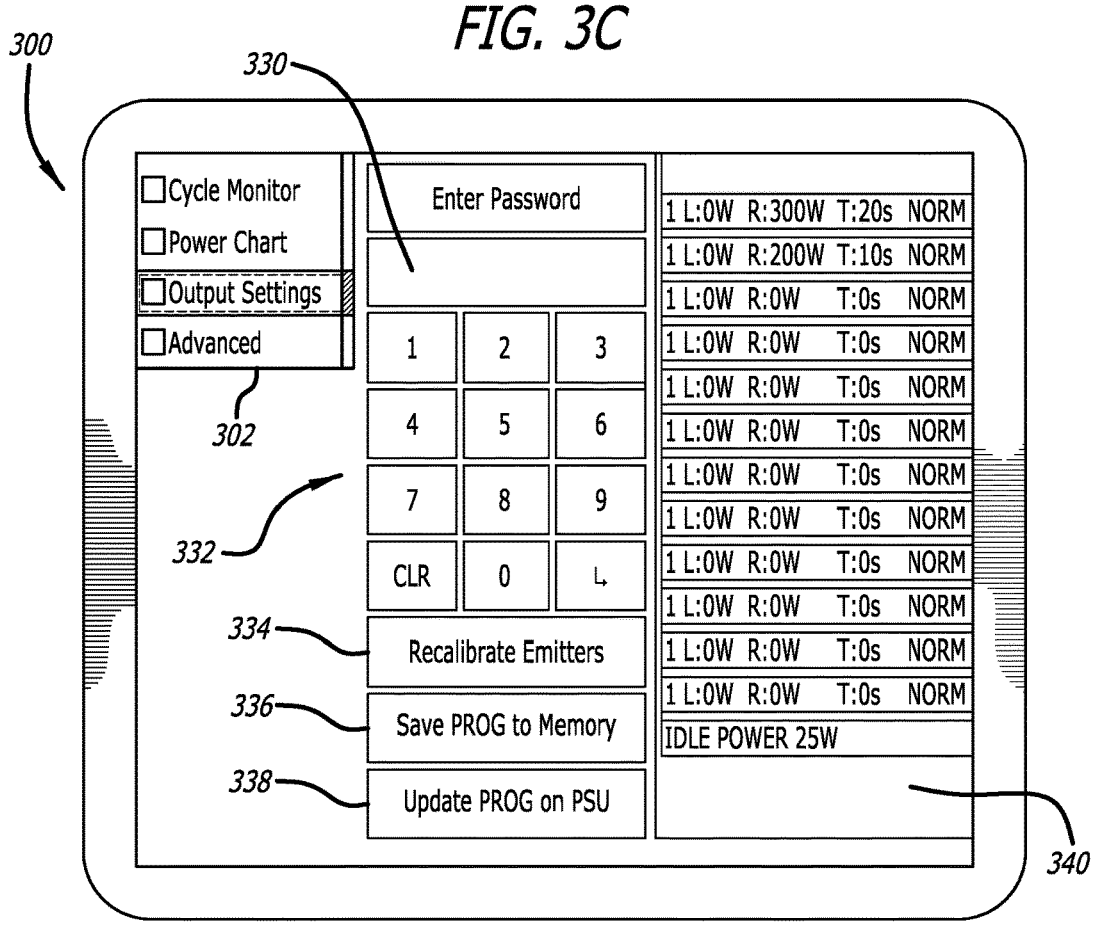
Figure 3E:
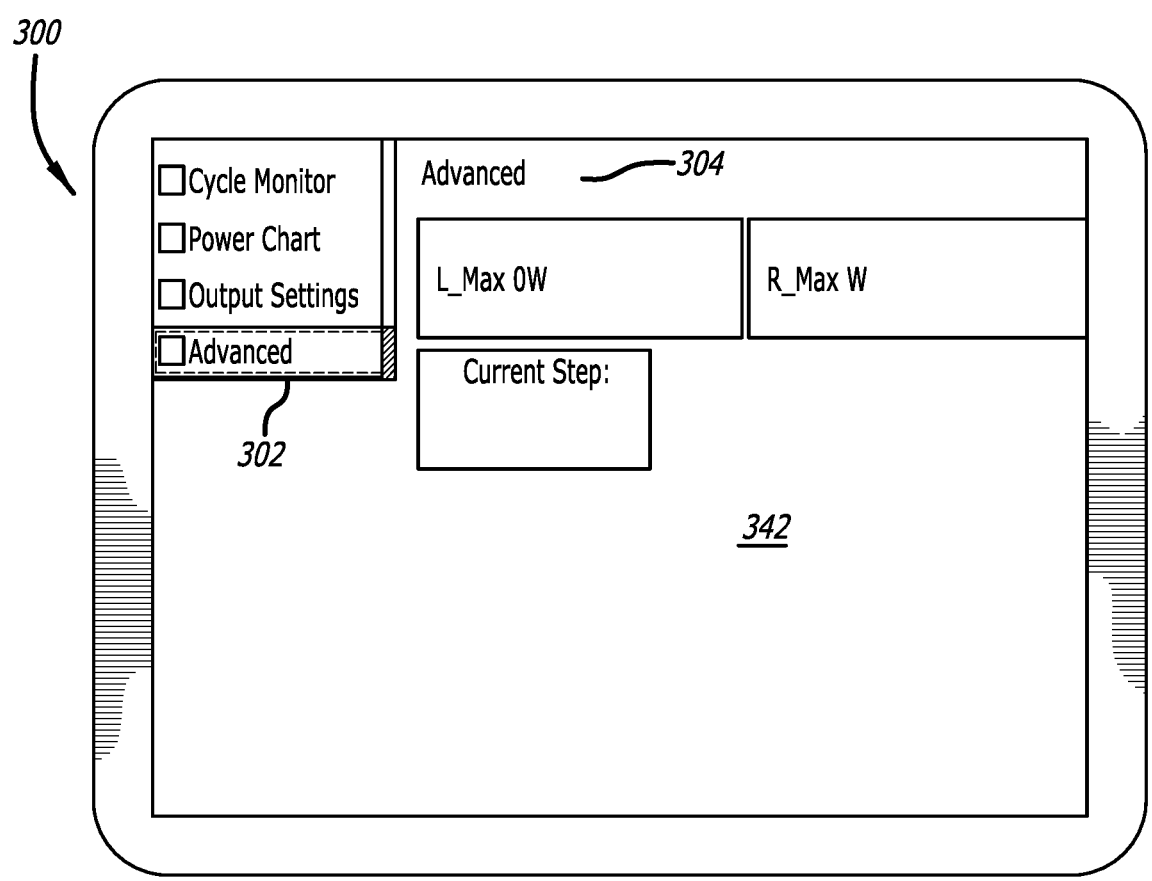

Referring now to FIGS. 3A-3E, a plurality of exemplary graphic user interface display screens are shown in accordance with some embodiments. Referring specifically to FIG. 3A, illustrates a graphical user interface (GUI) 300 displays a main ("home") display screen rendered on the display 110 of the control unit 106. Referring now to FIG. 3B, the GUI 300 is shown including a plurality of display components 302-326. Specifically, the main display screen 300 includes: a menu 302, a page title 304, an operational status listing 306, a program mode listing 308, a left emitter set-point indicator (value given by process steps) 310, an emergency stop button 312, a cycle start button 314, a right emitter set-point indicator (value given by process steps) 316, a left emitter output indicator (actual output) 318, a right emitter output indicator (actual output) 320, a program step display (displays current step during process) 322, a program step time duration display (displays time for given step during process) 324 and an idle output value (output power to emitter/s while equipment sits idle) 326.

Referring now to FIG. 3C, a power chart display is shown on the GUI 300 including the menu 302, the page title 304 and a graphical representation 328 of the output of the control unit 106 that displays power output versus time.

Referring now to FIG. 3D, a process programming display is shown on the GUI 300 including the menu 302, the page title 304, a password entry field 330, a numerical keypad 332, a cycle start for emitter calibration cycle 334, a program save button 336, a program upload to Power Source Unit (PSU) button 338, and a program step table 340.

Referring now to FIG. 3E, an advanced settings display is shown on the GUI 300 including the menu 302, the page title 304, display space 342 reserved for display of advanced settings such as password settings, idle output setting, optional feed control settings, options enable/disable, etc.

III. Emitter Apparatus

Figure 4A:
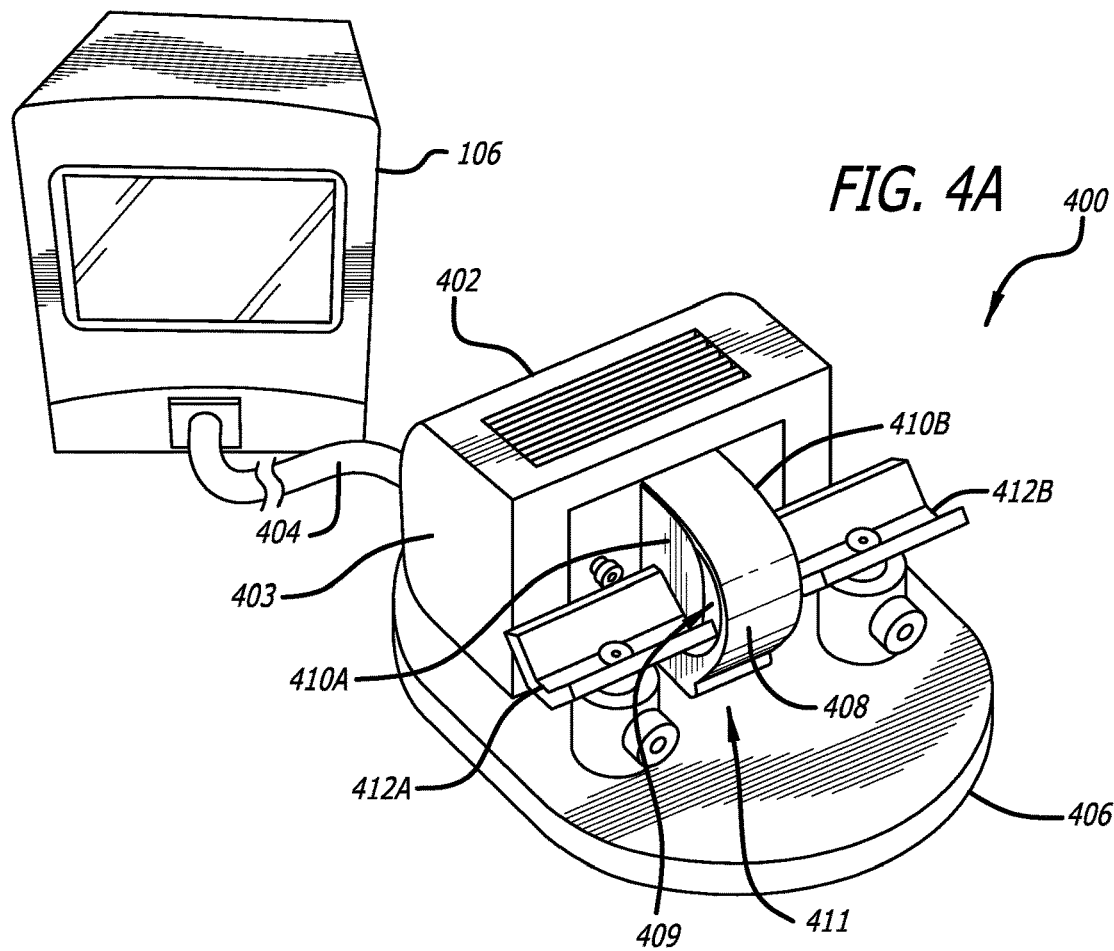
FIGS. 4A-4F illustrate a plurality of perspectives of an infrared energy emitter device in accordance with some embodiments.

Referring now to FIGS. 4A-4F, a plurality of perspectives of an infrared energy emitter device are shown in accordance with some embodiments. Specifically, FIG. 4A illustrates the infrared (IR) energy emitter device 400 in a second embodiment as compared to the IR energy emitter device 102 of FIG. 1. The IR energy emitter device 400 includes a heat dissipating housing 402, end caps 403, a coupling device (e.g., a power cord) 404, a base 406, a curved reflection component 408, first and second side reflection components 410A-410B, and guide rails 412A-412B. Herein, the curved reflection component 408 and the first and second side reflection components 410A-410B may collectively be referred to as "an outer reflection unit."

In some embodiments, optional electrically operated part feeders (not shown) may be included and replace the guide rails 412A-412B. The optional electrically operated part feeders are configured to automatically feed part through radiant heat focal point and controlled by executable logic of the control unit 106. In some embodiments, an optional air blow nozzle for part cooling (not shown) is included and configured to mount to the base 406 for part cooling after the heating operation and controlled by executable logic of the control unit 106. In yet some embodiments, an optional mounted microscope camera (not shown) is included and configured to capture the heating operation that then may be displayed on the graphical user interface (GUI) 300 or on a separate monitor.

The interior sides of each of the curved reflection component 408, the first and second side reflection components 410A-410B and the interior reflection unit 418, which includes an internal side reflector 419, may be comprised of a reflective material. Thus, the IR energy emitter device 400 is specifically configured to direct the IR rays at one or more target focal points, as shown in FIGS. 5A and 5D.

Figure 4B:
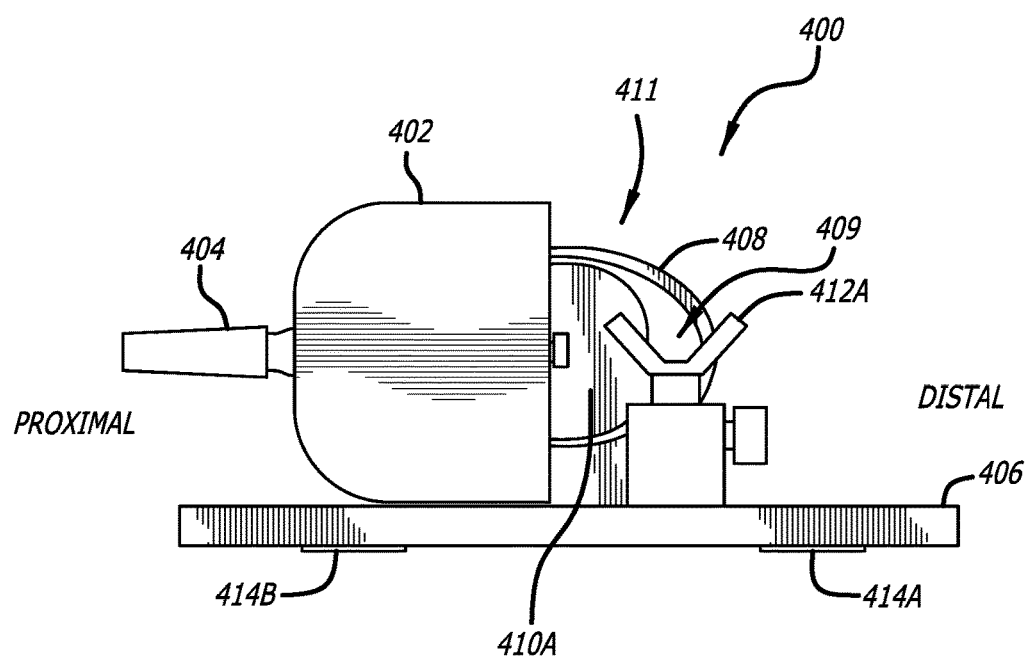
Figure 4C:
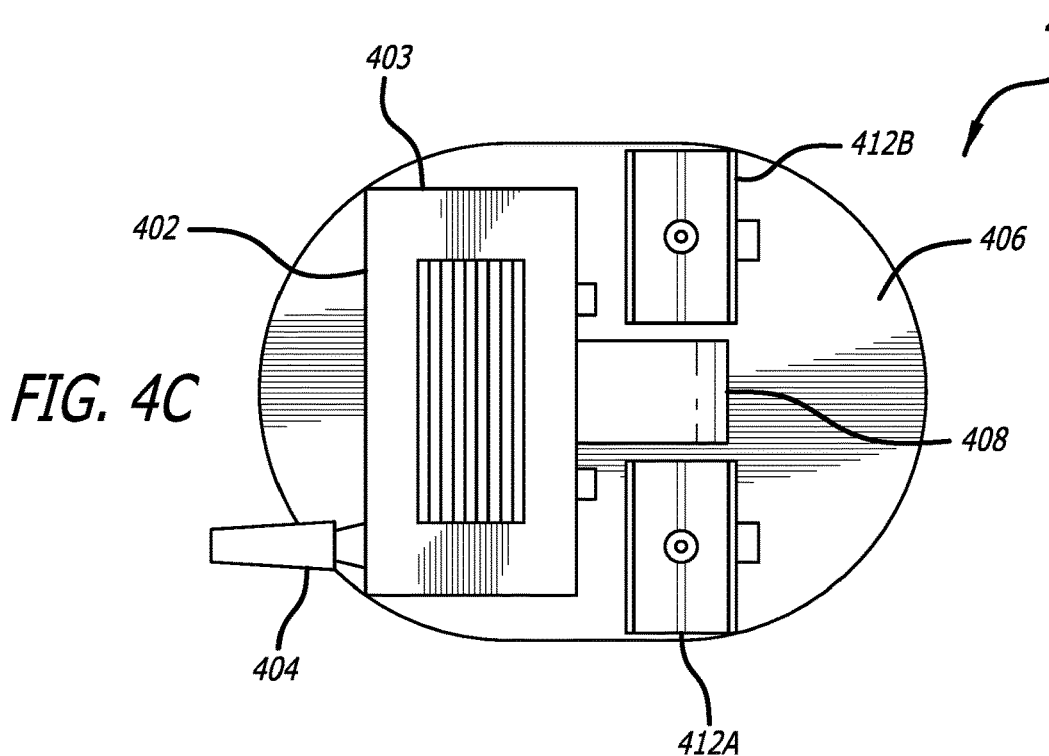

Referring now to FIGS. 4B-4C, a side perspective and a top perspective of the IR energy emitter device 400 are shown. As seen in FIG. 4B, the IR energy emitter device 400 includes feet 414A-414B extending from the base 406 (feet 414C-414D are not shown). Further, a spacing 409 is illustrated and formed as a result of the side reflection components 410A-410B extending a distance less than a distance extended by the curved reflection component 408. Thus, the spacing 409 is formed between a distal edge of the side reflection components 410A-410B and a distal most point of the curved reflection component 408.

Figure 4D:
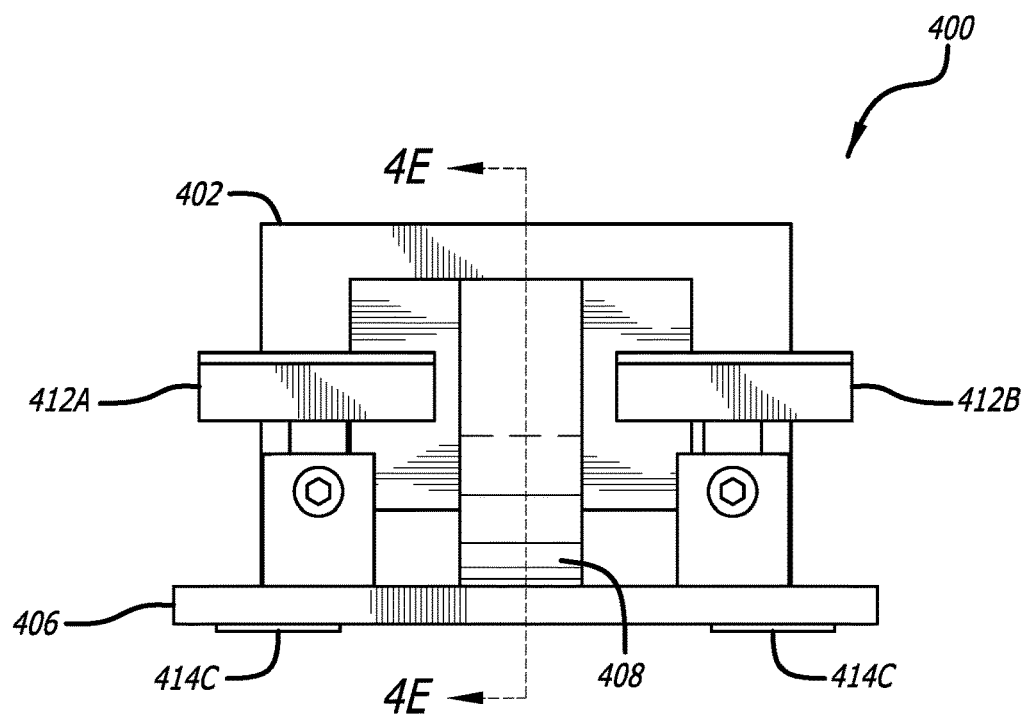
Figure 4E:
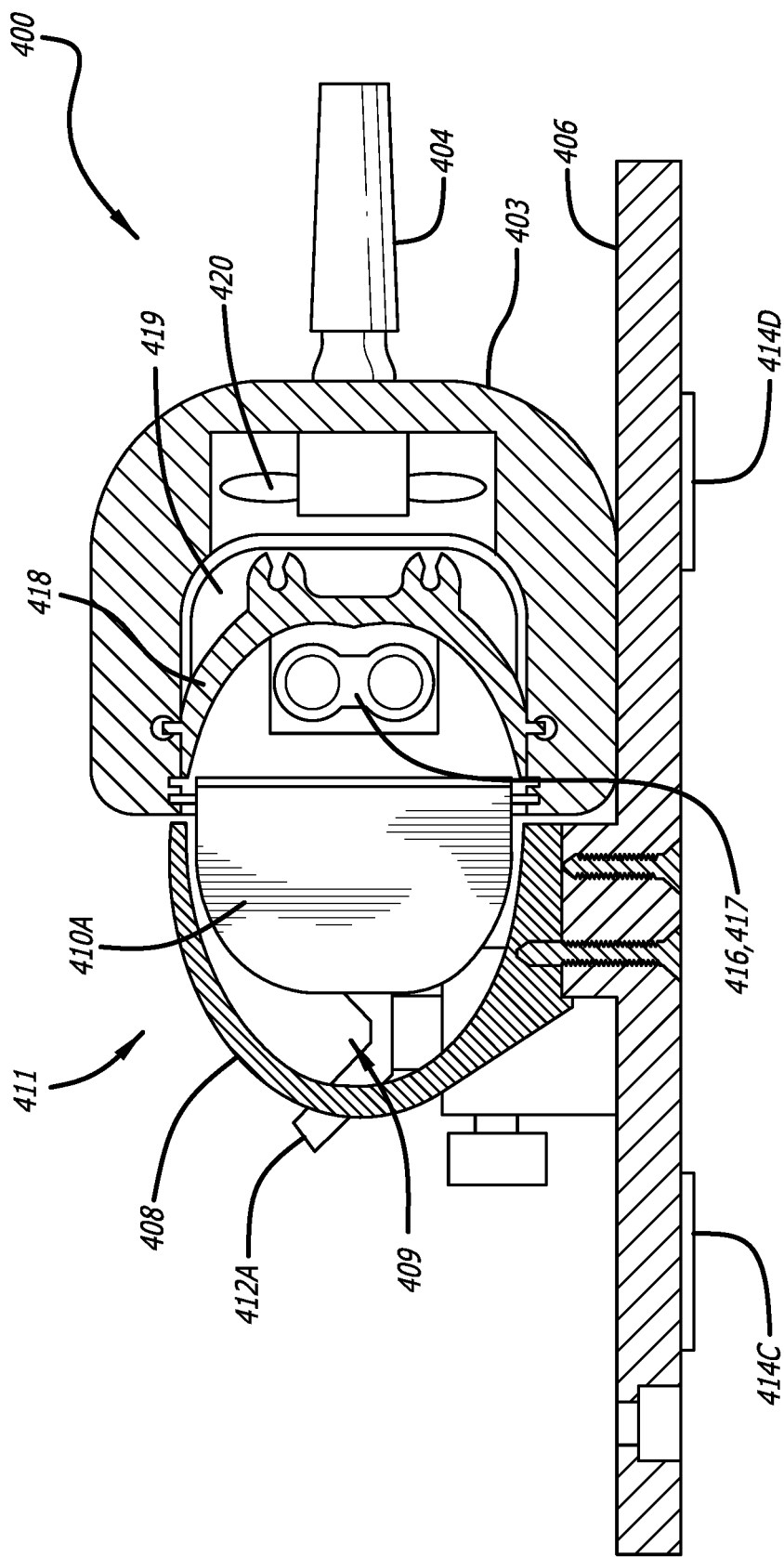

Referring now to FIG. 4D, a front perspective of the IR energy emitter device 400 is shown. The IR energy emitter device 400 is shown to include a line 4E-4E indicating the cross-sectional view of FIG. 4E. Referring now to FIG. 4E, a cross-sectional perspective of the IR energy emitter device 400 is shown. Through the cross-sectional view 4E-4E, the IR energy emitter device 400 is shown to include infrared bulb 416 having one or more filaments, an IR bulb socket 417, an interior reflection unit 418 (including an internal side reflector 419), and a cooling fan 420.

Figure 5A:
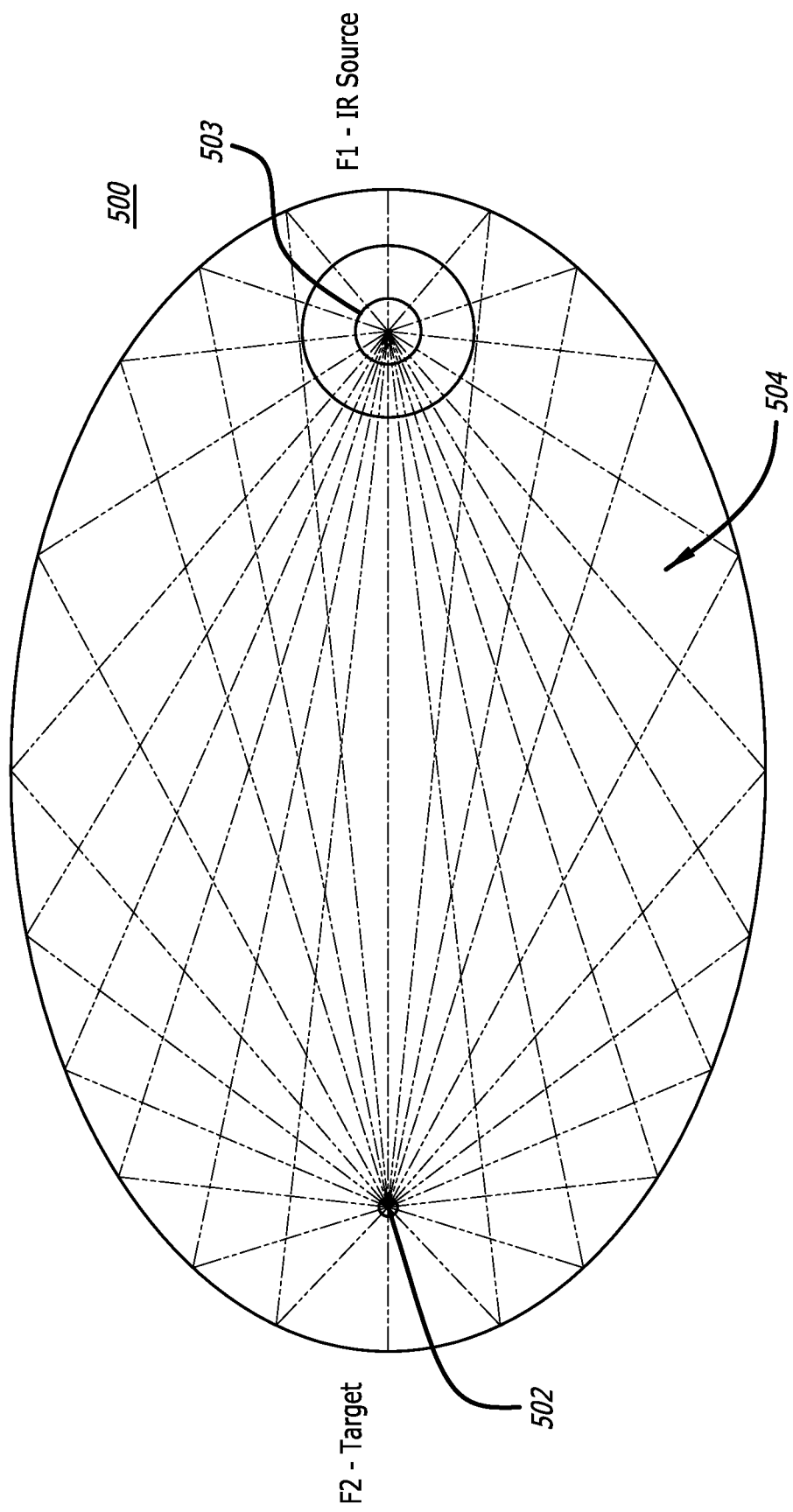
FIGS. 5A-5D illustrate a plurality of elliptical reflector designs in accordance with some embodiments.
Figure 5B:
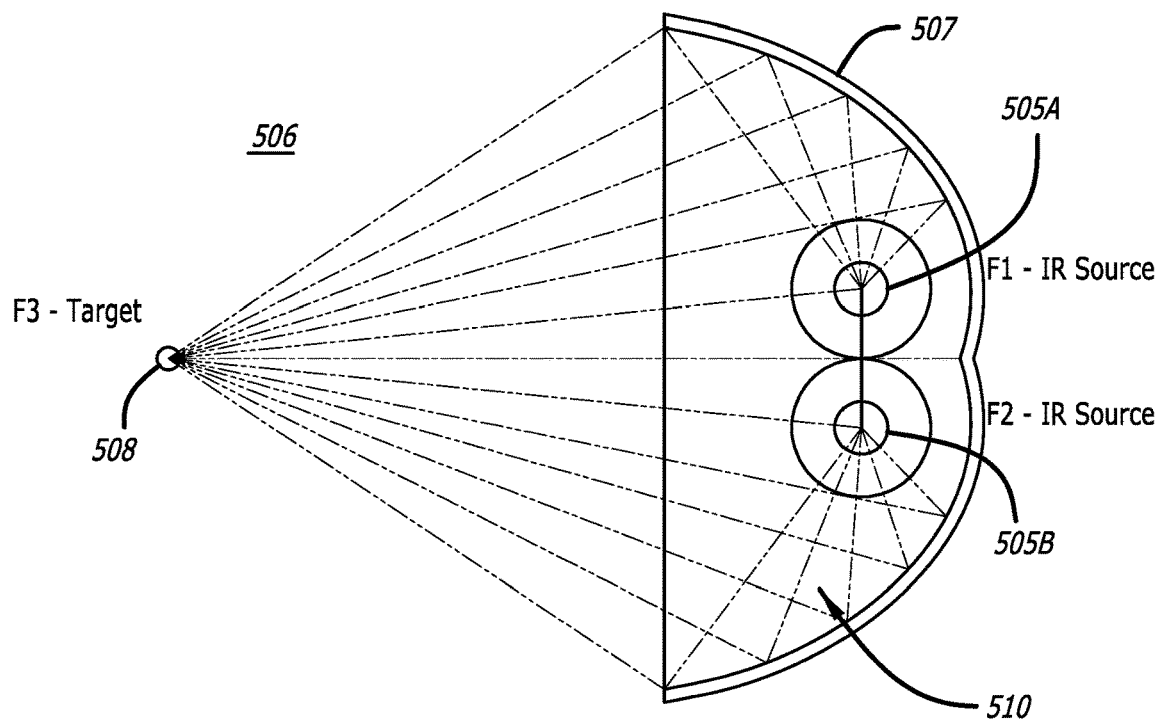
Figure 5C:
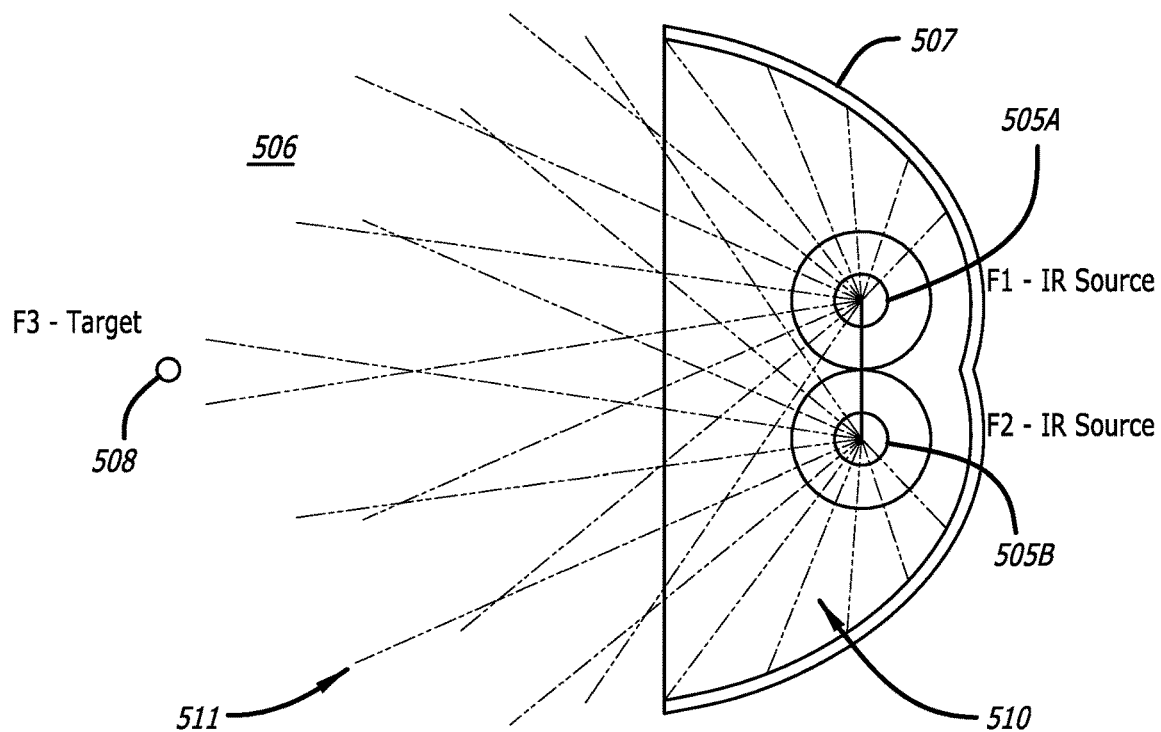
Figure 5D:
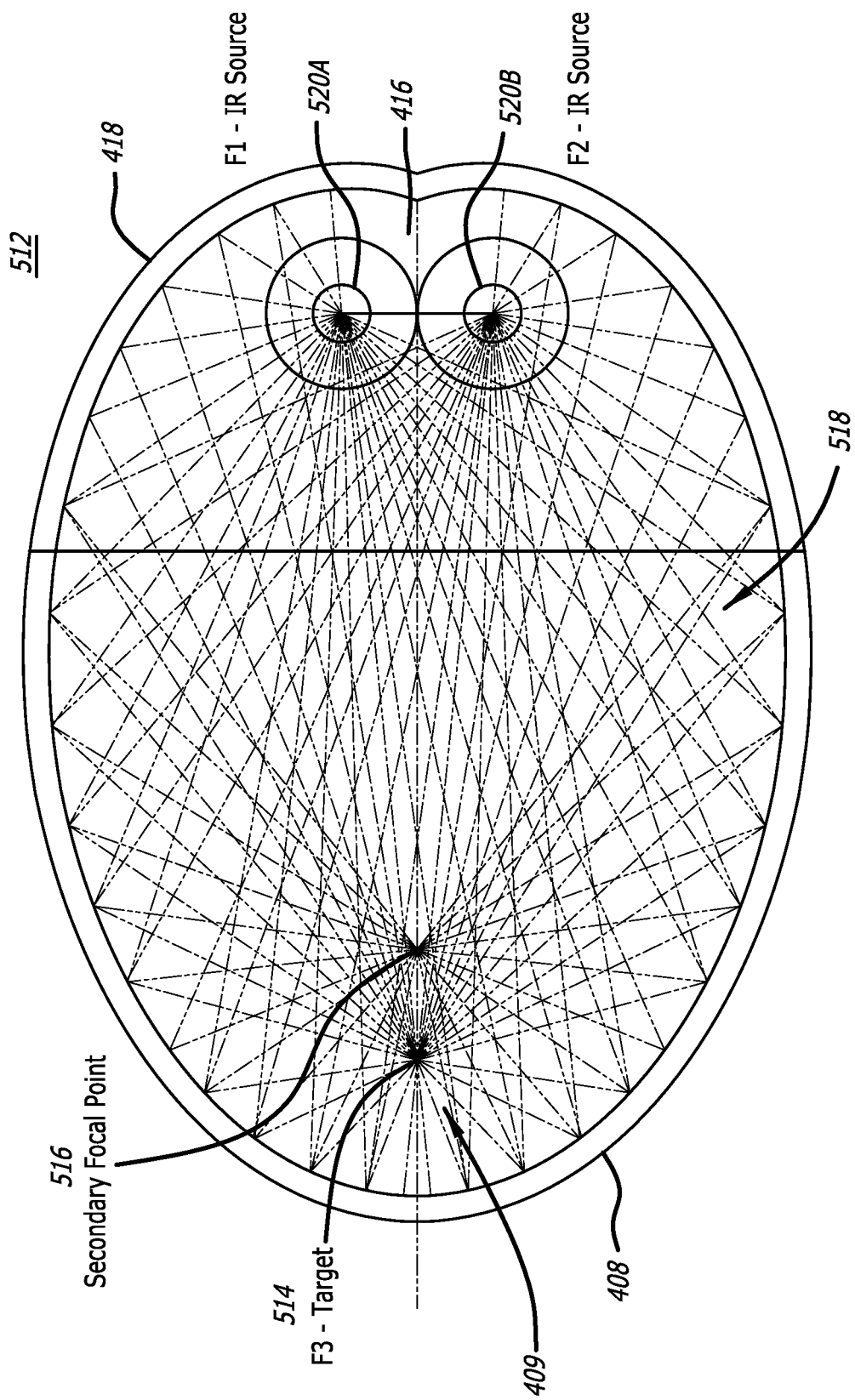

In some embodiments, the interior reflection unit 418 may be configured to be shaped as a portion of an elliptical, as seen in FIG. 5A. However, in other embodiments, the interior reflection unit 418 may be configured with a dual-curvature shape, as seen in FIGS. 4E and 5B-5C. As discussed in more detail below, when the IR energy emitter device 400 includes the IR bulb 416 having twin filaments, the specific configuration of the interior reflection unit 418 determines whether the IR rays are directed to a singular focal point, as seen in FIG. 5B, or are split between a target focal point and a secondary focal point, as seen in FIG. 5D.

Figure 4F:
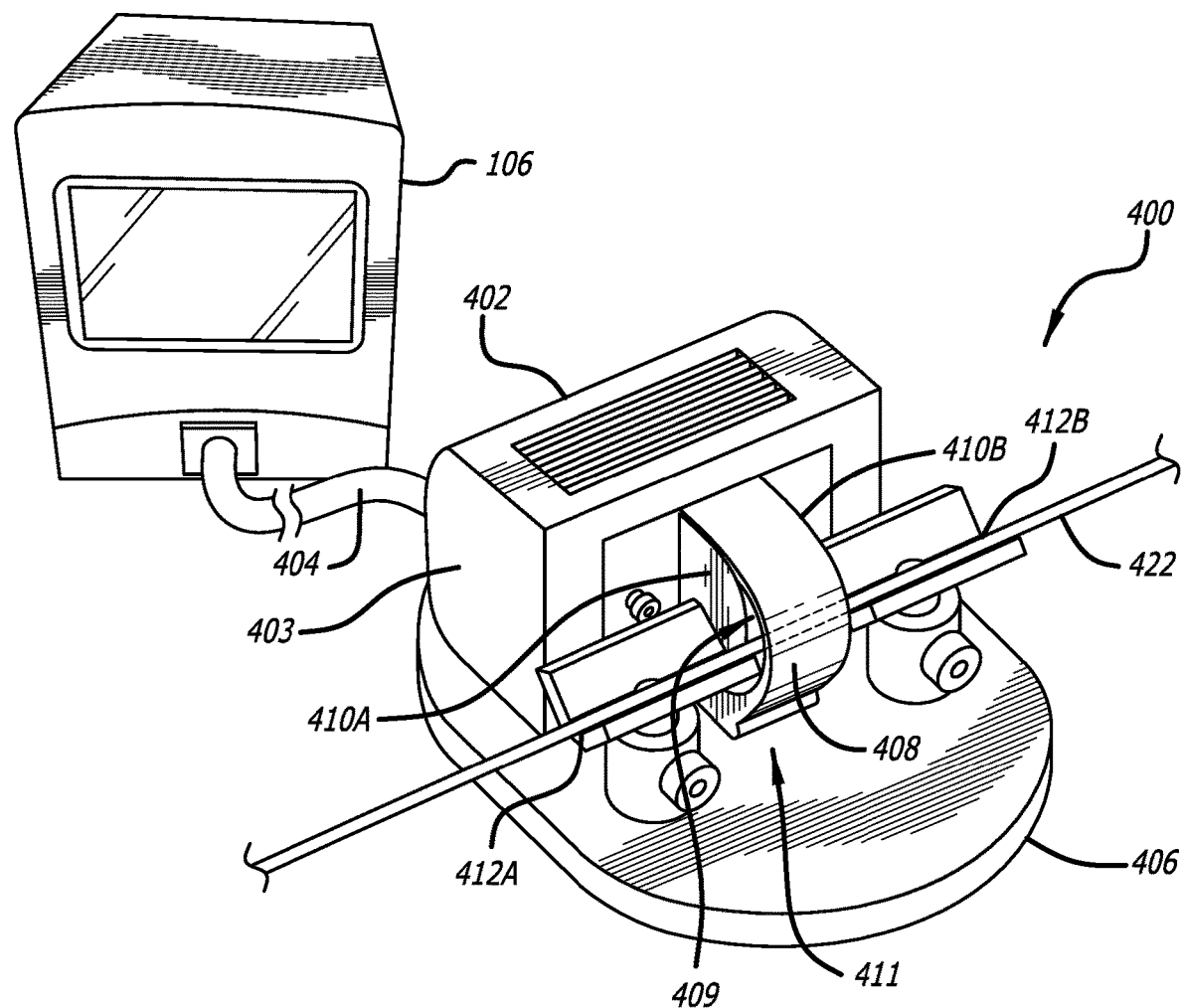

Referring to FIG. 4F, an illustration of the IR energy emitter device 400 of FIG. 4A during operation is shown in accordance with some embodiments. In particular, the IR energy emitter device 400 is shown during manufacturing of a medical instrument, e.g., catheter, 422. The catheter 422 is disposed on the guide rails 412A-412B. More specifically, the catheter 422 is shown as being guided through the spacing 409 between the distal edge of the side reflection components 410A-410B and the distal most point of the curved reflection component 408. As the catheter 422 passes through the outer reflection unit 411 via the spacing 409, the IR rays emitted from the IR bulb 416 heat the portion of the catheter 422 located at a focal point (e.g., any of the focal points 502, 508, 514 or 516 of FIGS. 5A-5D).

IV. Exemplary Infrared Ray Reflection Illustrations

Referring now to FIG. 5A, a first infrared (IR) ray reflection 500 is shown. The first IR ray reflection illustration 500 illustrates the theoretical elliptical reflector wherein an IR bulb having a singular filament is positioned at a focal point F1 503. The IR bulb would emit IR rays 504 that culminate at a singular focal point 502. In such an embodiment, all energy from the IR rays is received at the focal point 502.

In contrast and referring to FIGS. 5B-5C, a second IR ray reflection 506 is shown in which FIG. 5B illustrates the IR rays 510 that are received at the target F3 508 and FIG. 5C illustrates the IR rays 511 that are lost to the environment. As seen in FIG. 5B, a twin elliptical design may be utilized. The twin elliptical design delivers adequate energy for reflowing via a twin filament shortwave infrared emitting bulb. Twin filaments deliver twice the energy as a single filament bulb of equal length. A twin elliptical mirror is used to direct energy from two separate primary focal points F1, F2 (e.g., IR sources being filaments 505A-505B of an IR bulb) to a common secondary focal point F3 508. Conventional technologies often utilize a configuration akin to that shown in FIG. 5B that includes only a reflective surface 507 behind the filaments 505A-505B. There are several disadvantages to such a configuration. For example, there is an immense amount of energy loss, e.g., the IR rays 511 of FIG. 5C. In other words, the exemplary IR rays 510-511 are emitted from the filaments 505A-505B with the IR rays 510 of FIG. 5B received at the focal point F3 508 and the IR rays 511 of FIG. 5C are lost into the environment. Thus, the configuration illustrated in of FIGS. 5B-5C is very inefficient.

A second disadvantage is that only a portion of the focal point F3 508 receives the IR rays 510, i.e., the portion directed toward the filaments 505A-505B. As a comparison, the theoretical elliptical reflector of FIG. 5A provides IR rays 504 to the focal point F2 502 in a circumferential manner, i.e., the entire circumference of the focal point F2 502 receives IR rays 504. Therefore, if the configuration of FIGS. 5B-5C were used to apply heat to a medical instrument, such application of heat would only target a particular portion of the circumference of the medical instrument.

Referring now to FIG. 5D, an illustration of an embodiment including a twin elliptical reflector design is shown in accordance with some embodiments. The configuration of FIG. 5D illustrates the IR ray reflection 512 produced by the IR energy emitter device 400. In particular, reflective surfaces, e.g., mirrors, are specifically configured around the focal point F3 (i.e., target 514) such that the IR rays emitted from the two primary focal points F1, F2 (e.g., IR sources, e.g., filaments 520A-520B of IR bulb 416) are applied circumferentially to the focal point F3 514 and a secondary focal point 516 as illustrated. Such a configuration improves the application of IR rays to the focal point F3 as the entire circumference of the target receives IR rays as opposed to a minor portion of the circumference.

Further, as a result of this configuration, energy from the opposite filament to the elliptical shaped mirror will reflect and intersect at a point closer to the sources (the "secondary focal point"). The secondary focal point is a character of this configuration and may be found useful in certain applications. For example, the dual focal point configuration may be advantageous in heating two areas simultaneously. Further, providing two concentrations of energy (the focal point F3 and the secondary focal point) provides a greater area to apply heat. Such a configuration may be useful on larger parts or parts that are not necessarily round. In certain embodiments, a filter may be present at the bulb that filters or blocks certain areas of the emissions to control or balance the emissions at the focal points.

As is seen in FIG. 5D, the interior reflection unit 418 and the curved reflection component 408 fully encompass the two primary focal points F1, F2, the focal point F3 514 and the secondary focal point 516. As a result, the IR rays 518 reflect off of the interior reflection unit 418 and/or the curved reflection component 408 such that a greater amount of energy reaches the focal point F3 514. Additionally, first and second side reflection components 410A-410B reflect additional within the interior of the outer reflection unit 411, thereby further reducing loss of energy as compared to an implementation of FIGS. 5B-5C.

V. Alternative Emitter Apparatus

Figure 6A:
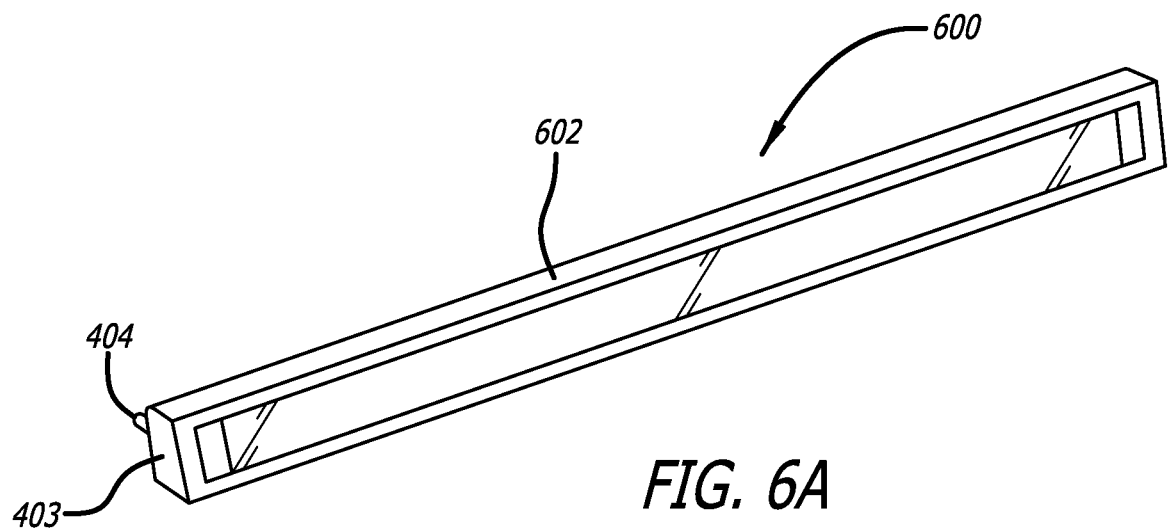
FIGS. 6A-6B illustrate a plurality of perspectives of an alternate infrared energy emitter device in accordance with some embodiments.
Figure 6B:
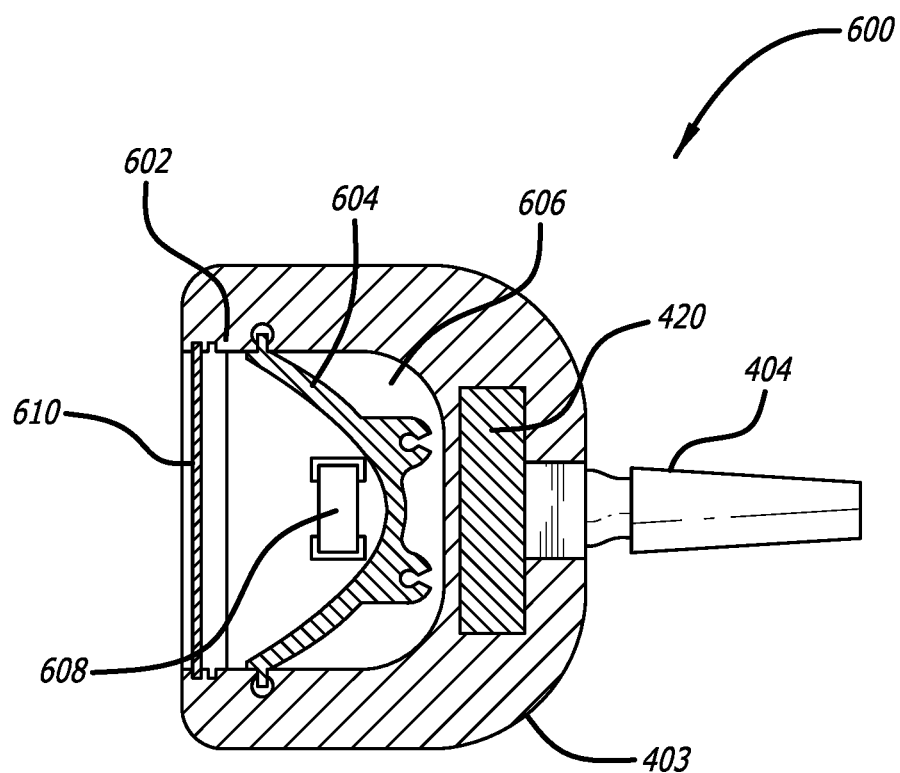

Referring now to FIGS. 6A-6B, a plurality of perspectives of an alternate infrared energy emitter device 600 is shown in accordance with some embodiments. The IR energy emitter device 600 is shown to include an extended version of the IR energy emitter device 400 and includes a heat dissipating housing 602 (same shape cut to a longer length), a coupling device (e.g., a power cord) 404, variant parabolic mirror 604, internal side mirror for single filament bulb 606, single filament bulb 608, and an aperture 610.

While some particular embodiments have been disclosed herein, and while the particular embodiments have been disclosed in some detail, it is not the intention for the particular embodiments to limit the scope of the concepts provided herein. Additional adaptations and/or modifications can appear to those of ordinary skill in the art, and, in broader aspects, these adaptations and/or modifications are encompassed as well. Accordingly, departures may be made from the particular embodiments disclosed herein without departing from the scope of the concepts provided herein.

What is claimed is:

1. An infrared energy supply system comprising:
   an infrared (IR) energy emitter device including:
      a heat dissipating housing including an internal cavity that houses a first IR bulb and a second IR bulb, an interior reflection unit, and a cooling fan,
      an outer reflection unit coupled to the heat dissipating housing, wherein the outer reflection unit includes (i) a curved reflection component extending outwardly from the heat dissipating housing, and (ii) side reflection components that extend outward from the heat dissipating housing on opposite sides of the curved reflection component, wherein the interior reflection unit, the curved reflection component, and the side reflection components form a twin elliptical reflector configuration that is configured to reflect energy emitted from the first IR bulb and the second IR bulb toward a target focal point and a secondary focal point, and a guide rail disposed on both sides of the outer reflection unit; and a control unit coupled to the infrared energy emitter device via a coupling device.

2. The infrared energy supply system of claim 1, wherein the curved reflection component extends outwardly from both of a top and a bottom of an opening of the internal cavity.

3. The infrared energy supply system of claim 1, wherein the side reflection components extend a distance less than a distance extended by the curved reflection component thereby creating a spacing between a distal edge of the side reflection components and a distal most point of the curved reflection component.

4. The infrared energy supply system of claim 1, wherein output heat of the IR energy emitter device is controlled and monitored by the control unit.

5. The infrared energy supply system of claim 1, wherein the control unit includes is a display screen configured as an interface for a user and to receive user input.

6. The infrared energy supply system of claim 5, wherein the control unit includes:
one or more processors, and
non-transitory computer-readable medium coupled to the one or more processors, and having stored thereon logic that, when executed by the one or more processors, causes performance of operations including:
generating and causing rendering of a Graphical User Interface (GUI) on the screen display, and
receiving the user input.

7. The infrared energy supply system of claim 6, wherein the logic, when executed by the one or more processors, causes performance of further operations including:
in response to the user input, transmitting an electrical signal to the IR energy emitter device initiating emission of IR rays.

8. The infrared energy supply system of claim 1, wherein IR rays emitted from the first IR bulb and the second IR bulb reflect off of the interior reflection unit.

9. The infrared energy supply system of claim 1, wherein the internal cavity houses multiple IR bulbs, and
wherein IR rays emitted from the multiple IR bulbs reflect off of the interior reflection unit and the curved reflection component to culminate at the target focal point and the secondary focal point.

10. The infrared energy supply system of claim 9, wherein the interior reflection unit is configured with a dual-curvature shape.

11. An infrared (IR) energy emitter device comprising:
a heat dissipating housing including an internal cavity that houses a first IR bulb and a second IR bulb, an interior reflection unit, and a cooling fan;
an outer reflection unit coupled to the heat dissipating housing, wherein the outer reflection unit includes (i) a curved reflection component extending outwardly from the heat dissipating housing, and (ii) side reflection components that extend outward from the heat dissipating housing on opposite sides of the curved reflection component, wherein the interior reflection unit, the curved reflection component, and the side reflection components form a twin elliptical reflector configuration that is configured to reflect energy emitted from the first IR bulb and the second IR bulb toward a target focal point and a secondary focal point; and a guide rail disposed on one or more sides of the outer reflection unit.

12. The infrared energy emitter device of claim 11, wherein the curved reflection component extends outwardly from both of a top and a bottom of an opening of the internal cavity.

13. The infrared energy emitter device of claim 11, wherein the side reflection components extend a distance less than a distance extended by the curved reflection component thereby creating a spacing between a distal edge of the side reflection components and a distal most point of the curved reflection component.

14. The infrared energy emitter device of claim 11, wherein output heat of the infrared energy emitter device is controlled and monitored by a control unit that is communicatively coupled to the infrared energy emitter device.

15. The infrared energy emitter device of claim 14, wherein the control unit includes is a display screen configured as an interface for a user and to receive user input.

16. The infrared energy emitter device of claim 15, wherein the control unit includes:
one or more processors, and
non-transitory computer-readable medium coupled to the one or more processors, and having stored thereon logic that, when executed by the one or more processors, causes performance of operations including:
generating and causing rendering of a Graphical User Interface (GUI) on the screen display, and
receiving the user input.

17. The infrared energy emitter device of claim 16, wherein the logic, when executed by the one or more processors, causes performance of further operations including:
in response to the user input, transmitting an electrical signal to the IR energy emitter device initiating emission of IR rays.

18. The infrared energy emitter device of claim 11, wherein IR rays emitted from the first IR bulb and the second IR bulb reflect off of the interior reflection unit.

19. The infrared energy emitter device of claim 11, wherein the internal cavity houses multiple IR bulbs, and
wherein IR rays emitted from the multiple IR bulbs reflect off of the interior reflection unit and the curved reflection component to culminate at the target focal point and the secondary focal point.

20. The infrared energy emitter device of claim 19, wherein the interior reflection unit is configured with a dual-curvature shape.

21. The infrared energy supply system of claim 1, wherein the first IR bulb and the second IR bulb are disposed in a vertical arrangement at a proximal end of the internal cavity, and the target focal point and the secondary focal point are aligned horizontally at a distal side of the outer reflection unit.

22. The infrared energy emitter device of claim 11, wherein the first IR bulb and the second IR bulb are disposed in a vertical arrangement at a proximal end of the internal cavity, and the target focal point and the secondary focal point are aligned horizontally at a distal side of the outer reflection unit.

* * * * *